(12) United States Patent
Takatani

(10) Patent No.: US 6,855,570 B2
(45) Date of Patent: Feb. 15, 2005

(54) COMPOUND SEMICONDUCTOR LASER

(75) Inventor: Kunihiro Takatani, Yamatotakada (JP)

(73) Assignee: Sharp Kabushiki Kaisha, Abeno-ku (JP)

( * ) Notice: Subject to any disclaimer, the term of this patent is extended or adjusted under 35 U.S.C. 154(b) by 0 days.

(21) Appl. No.: 10/465,164

(22) Filed: Jun. 18, 2003

(65) Prior Publication Data

US 2003/0206567 A1 Nov. 6, 2003

Related U.S. Application Data

(63) Continuation of application No. 09/402,135, filed as application No. PCT/JP98/01308 on Mar. 25, 1998, now Pat. No. 6,597,716.

(30) Foreign Application Priority Data

Mar. 27, 1997 (JP) .............................................. 9-074779

(51) Int. Cl.$^7$ .............................................. H10L 21/00
(52) U.S. Cl. .............................. 438/37; 438/47; 372/46
(58) Field of Search ......................... 438/37, 47; 372/46

(56) References Cited

U.S. PATENT DOCUMENTS

| | | | |
|---|---|---|---|
| 4,691,321 A | | 9/1987 | Motegi et al. |
| 5,583,880 A | | 12/1996 | Shakuda |
| 5,734,670 A | * | 3/1998 | Ono et al. ..................... 372/45 |
| 5,742,629 A | * | 4/1998 | Nishikawa et al. ............ 372/46 |
| 5,812,576 A | * | 9/1998 | Bour ............................ 372/45 |
| 5,822,347 A | * | 10/1998 | Yokogawa et al. ............ 372/45 |
| 6,055,255 A | * | 4/2000 | Suyama et al. ............... 372/46 |

FOREIGN PATENT DOCUMENTS

| | | |
|---|---|---|
| JP | 01-184973 | 7/1989 |
| JP | 05-003376 A | 1/1993 |
| JP | 07 235723 | 9/1995 |
| JP | 08-056055 A | 2/1996 |
| JP | 08-097507 | 4/1996 |
| JP | 09-270569 A | 10/1996 |
| JP | 08-018159 A | 1/1997 |

OTHER PUBLICATIONS

Nakamura et al., (1996). "InGaN–Based Multi–Quantum–Well–Structure Laser Diodes", *Jpn. J. Appl. Phys.* vol. 35, Part 2, No. 1B, L74–L76. (Jan. 1996).

Nakamura et al., (1996). "Ridge–Geometry InGaN Multi–Quantum–Well–Structure Laser Diodes", *Appl. Phys. Lett.* 69(10):1477–1479. (Sep. 1996).

* cited by examiner

*Primary Examiner*—George Fourson
*Assistant Examiner*—F. L. Toledo
(74) *Attorney, Agent, or Firm*—Morrison & Foerster LLP

(57) ABSTRACT

A compound semiconductor laser of a III group nitride semiconductor of the present invention includes a first cladding layer 104 of a first conduction type formed on a substrate 101, an active layer 106 formed on the first cladding layer, a second cladding layer 108 of a second conduction type formed on the active layer 106, and a buried layer 110 formed on the second cladding layer 108, the buried layer having an opening portion for constricting a current in a selected region of the active layer, wherein an upper portion of the second cladding layer 108 has a ridge portion, the ridge portion residing in the opening portion of the buried layer 110, and the buried layer 110 does not substantially absorb light output from the active layer 106, and the buried layer has a refractive index which is approximately identical with that of the second cladding layer 108.

6 Claims, 11 Drawing Sheets

FIG. 11
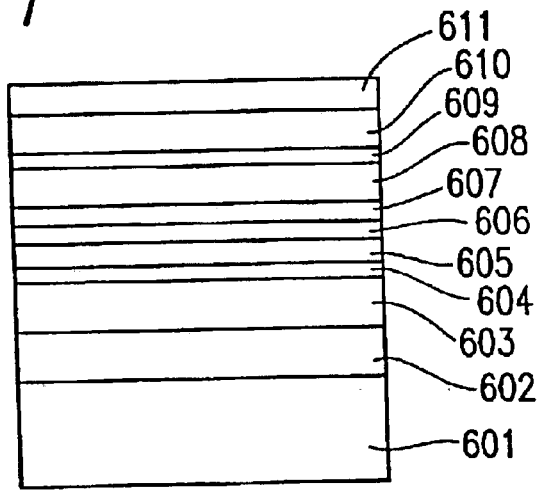
(a)
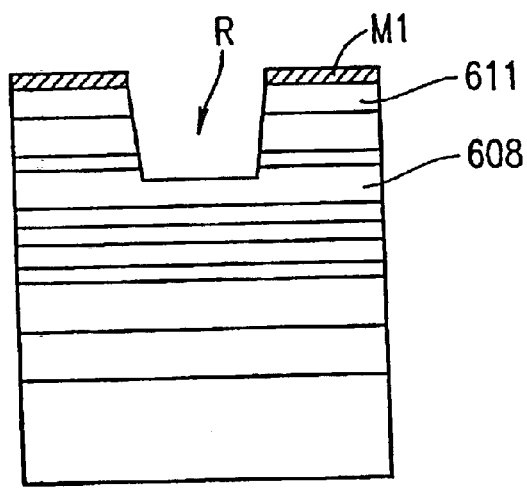
(b)
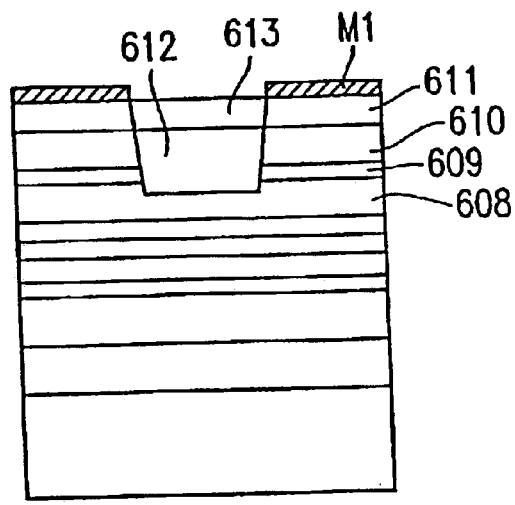
(c)

COMPOUND SEMICONDUCTOR LASER

CROSS-REFERENCE TO RELATED APPLICATIONS

This application is a continuation of U.S. patent application Ser. No. 09/402,135, which has an official filing date of Sep. 27, 1999, now U.S. Pat. No. 6,597,716 and which is a National Phase filing of PCT/JP98/01308 filed Mar. 25, 1998 which claimed the benefit of Japanese Patent Application No. 9-074779, filed on Mar. 27, 1997 the contents of each of which are incorporated herein by reference in their entirety.

TECHNICAL FIELD

The present invention relates to a semiconductor laser formed of a III group nitride semiconductor.

BACKGROUND ART

FIG. 1 is a schematic cross-sectional view showing a conventional ridge waveguide type III group nitride semiconductor laser. A semiconductor laser of FIG. 1 has a stack structure including a GaN buffer layer 202, an n-GaN contact layer 203, an n-GaN buffer layer 204, an n-AlGaN cladding layer 205, an n-GaN guiding layer 206, an InGaN-MQW active layer 207, a p-AlGaN cap layer 208, a p-GaN guiding layer 209, a p-AlGaN cladding layer 210, and a p-GaN contact layer 211 on a sapphire substrate 201. Since the sapphire substrate is insulative, a portion of the stack structure is etched down to the n-type contact structure 203 in order to expose a region to which an n-type electrode is attached. Furthermore, a portion of a mesa structure is etched down to the p-type cladding layer 210 in order to form a ridge waveguide. In these processes, a dry etching method is employed, and an $SiO_2$ protect film 214 is added for protecting the etched portion.

FIG. 2 shows a relationship between the thickness of the residual p-cladding layer and an effective refractive index difference between the inside and the outside of a stripe (a ridge portion) (a curved line of the conventional example shown in FIG. 2). In the conventional ridge waveguide type III group nitride semiconductor, by utilizing the refractive index difference caused by the difference in thickness of the p-AlGaN cladding layer 210 between inside and outside the ridge portion as shown in FIG. 2, an effective refractive distribution in a (A) portion and a (B) portion is formed, thereby controlling a transverse mode. The control for the effective refractive index in the (B) portion of FIG. 1 is conducted by regulating a film thickness T of the p-AlGaN cladding layer 210 which has been left unetched.

Thus, optical characteristics wherein a light-emitting angle in the vertical direction is 34° and a light-emitting angle in the horizontal direction is 7° are obtained under the CW operation at a room temperature. Furthermore, a device duration under the CW operation at a room temperature is about 35 hours. FIG. 3 shows a variation of an operation current of the conventional ridge waveguide type III group nitride semiconductor laser under the CW operation at a room temperature.

However, in the conventional ridge waveguide type III group nitride semiconductor laser as shown in FIG. 1, there was a problem that fabricating a semiconductor laser having a uniform transverse characteristic with a high yield is extremely difficult. Dry etching such as RIE, RIBE or the like is employed for etching because no suitable chemical etchant exists for the III group nitride semiconductor, and the control of film thickness for a P-AlGaN layer 210 of a portion (B) in FIG. 1 is conducted by time control because no suitable etching stop layer exists. However, time control or else employ a less precise technique. As a result, a film thickness of the P-AlGaN layer 210 varies between plural lots or in the same wafer, whereby controllability of the transverse mode is considerably damaged, and the production yield deteriorates.

Another problem is short lifetime under the CW condition at a room temperature. The inventor of the present application has discovered that this results from using dry etching as a processing method for forming a stripe-shaped ridge shape. More specifically, the above problem results from side surfaces and a bottom surface of a semiconductor to be etched being damaged by an etching treatment, thereby causing a crystal defect, and pinholes being present in $SiO_2$ of an $SiO_2$ protection film covering a p-AlGaN cladding layer on the side surface of the ridge and outside the ridge, whereby the crystal surface in fact cannot be sufficiently protected.

The present invention is made in light of the above conditions, and an object thereof is to provide a semiconductor laser having a single transverse mode characteristic, which can be fabricated with high production yield.

DISCLOSURE OF INVENTION

A compound semiconductor laser of a III group nitride semiconductor according to the present invention includes a first cladding layer of a first conduction type formed on a substrate, an active layer formed on the first cladding layer; a second cladding layer of a second conduction type formed on the active layer; and a buried layer formed on the second cladding layer the buried layer having an opening portion for constricting a current in a selected region of the active layer, wherein an upper portion of the second cladding layer has a ridge portion, the ridge portion residing in the opening portion of the buried layer, and the buried layer does not substantially absorb light output from the active layer, and the buried layer has a refractive index which is approximately identical with that of the second cladding layer, whereby the above object is achieved.

In one embodiment, a light guiding layer of the second conduction type having a refractive index of a higher value than that of the second cladding layer, a third cladding layer of the second conduction type, and a contact layer of the second conduction type are sequentially formed in this order on the upper portion of the second cladding layer.

In one embodiment, the light guiding layer is made of InGaAlN.

In one embodiment, the buried layer is a dielectric film including at least one or more types of compounds among a group including $TiO_2$, $ZrO_2$, $HfO_2$, $CeO_2$, $In_2O_3$, $Nd_2O_3$, $Sb_2O_3$, $SnO_2$, $Ta_2O_5$, and ZnO.

In one embodiment, the buried layer is made of a ZnMgCdSSe compound semiconductor.

In one embodiment, the buried layer is made of a semiconductor whose composition is approximately identical with that of the second cladding layer.

In one embodiment, the buried layer is insulative or of the first conduction type.

In one embodiment, a contact layer of the second conduction type is formed on the upper portion of the second cladding layer.

A compound semiconductor laser of a III group nitride semiconductor according to the present invention includes a first cladding layer of a first conduction type formed on a substrate, an active layer formed on the first cladding layer, a second cladding layer of a second conduction type formed on the active layer, and a reflection layer formed on the second cladding layer, the reflection layer having an opening portion for constricting a current in a selected region of the active layer, wherein a layer of a semiconductor of the second conduction type, whose composition is approximately identical with that of the second cladding layer, is formed in the opening portion of the reflection layer, and the reflection layer has a refractive index of a lower value than that of the second cladding layer, whereby the above object is achieved.

In one embodiment, the reflection layer is made of InGaAlN.

In one embodiment, the reflection layer is insulative or of the first conduction type.

In one embodiment, a third cladding layer of the second conduction type and a contact layer of the second conduction type are formed on the reflection layer.

Hereinafter, the function of the present invention will be described.

The present invention enables to provide a device structure in which a transverse mode does not vary against a variation of the amount of etching, and to efficiently fabricate a ridge waveguide type III group nitride semiconductor laser with uniform characteristics.

Furthermore, a device with significantly improved operating lifetime is realized in which a crystal defect caused by damage generated in an etching process is prevented from propagating to an active layer under the CW operation by providing a dielectric layer with smaller pinholes outside the ridge-shaped stripe formed by etching or a structure in which a semiconductor layer is formed to be thick, thereby substantially burying a ridge-shaped stripe.

Furthermore, a device with significantly improved operating lifetime is also realized in which a crystal defect caused by damage generated in an etching process is prevented from propagating to an active layer under the CW operation or by using a convex-shaped groove portion, which has formed by etching, as a current path or by providing a structure buried with a semiconductor layer.

FIG. 2 shows an effective refractive index difference between the inside and the outside of the stripe in a device structure having no light guide layer when an etched portion is buried with a material having a refractive index identical with that of a p-cladding layer (a line of the present invention in FIG. 2). As shown in FIG. 2, according to the present invention, the effective refractive index difference between the inside and the outside of the stripe is eliminated. On the other hand, a gain difference occurs in a portion right under a ridge in the active layer and a portion right under the buried layer by a current constriction effect of the ridge buried layer; and as a result, the transverse mode is controlled. In the structure, an error tolerance range with respect to an etching depth in an etching process for forming a ridge is wide, a transverse mode controllability becomes stable, and the production yield of a laser device with uniform characteristics therefore improves.

Furthermore, these materials to be buried do not generate heat due to light absorption because they are transparent with respect to a light having an emission wavelength of the laser, or affect the transverse mode of the laser because they have an approximately identical refractive index with that of the second cladding layer; therefore, they are suitable as a buried layer.

Furthermore, a crystal defect caused by damage generated in an etching process is prevented from propagating to an active layer under the CW operation because a ridge-shaped stripe portion formed by etching is buried with the buried layer, whereby a device with significantly improved operating lifetime is realized. Furthermore, when a III group nitride semiconductor of an approximately identical composition with that of the second cladding layer is used as a material for the buried layer, a difference in a lattice constant between the buried layer and another epitaxial layer disappears. Thus, effects which a stress such as a thermal strain give to a device can be avoided.

FIG. 4 shows a relationship between a p-cladding layer residual film thickness and an effective refractive index difference between the inside and the outside of a stripe (a conventional example in FIG. 4), and a relationship between the p-cladding layer residual film thickness and an effective refractive index difference between the inside and the outside of a stripe when an etched portion is buried with a material having the same refractive index as that of the p-cladding layer (present invention in FIG. 4), in a device structure having a light guide layer. By providing a structure in which the light guide layer is included in the ridge portion as described above, an effective refractive index inside the ridge becomes large as shown in FIG. 4, whereby a light distribution region in a lateral direction is concentrated in the center. As a result, a transverse mode control becomes easier than in a ridge waveguide type laser utilizing a gain difference as described above. When the buried layer is not provided, or when a refractive index of the buried layer is different from that of the second cladding layer, a thickness of the second cladding layer outside the ridge (an etching residual film thickness) is related to a value of an effective refractive index outside the ridge, thereby significantly affecting the characteristics of the laser.

However, in the structure of the present invention, a refractive index of a buried layer is identical with that of the second cladding layer; therefore, a thickness of the second cladding layer outside the ridge (an etching residual film thickness) does not affect an effective refractive index outside the ridge. Thus, it is not necessary to finely control an etching depth, and it is only required that the etching depth reaches a light guide layer-second cladding layer interface such that at least the light guide layer is present inside the ridge. Furthermore, even when over-etched, it is only required that the etching bottom surface is present inside the second cladding layer. Thus, an error tolerance range during etching is large, controllability of the transverse mode becomes stable, and the production yield of a laser improves.

According to the present invention, by providing a semiconductor layer having an opening portion, which is of the first conduction type or insulative and exhibits a lower refractive index than that of the second cladding layer, a device current is concentrated in the opening portion, thereby generating a gain distribution in a lateral direction of the laser. Furthermore, an effective refractive index becomes relatively larger in a semiconductor layer in the opening portion than in other portions, and a light distribution region in the lateral direction is concentrated to the center, whereby the transverse mode control, in addition to an effect of the above-described gain distribution, becomes easier.

Furthermore, by employing InGaAlN as a material for a semiconductor layer deposited on the second cladding layer, which exhibits a lower refractive index than that of the second cladding layer, respective III group nitride layers which are sequentially grown on the layer can be epitaxially grown while suppressing the generation of a defect, thereby improving the reliability of the laser.

BRIEF DESCRIPTION OF DRAWINGS

FIG. 11 is a schematic view showing fabrication steps of the semiconductor laser according to Example 4 of the present invention.

BEST MODE FOR CARRYING OUT THE INVENTION

Hereinafter, examples of the present invention will be described with reference to the drawings.

EXAMPLE 1

Figure 1:
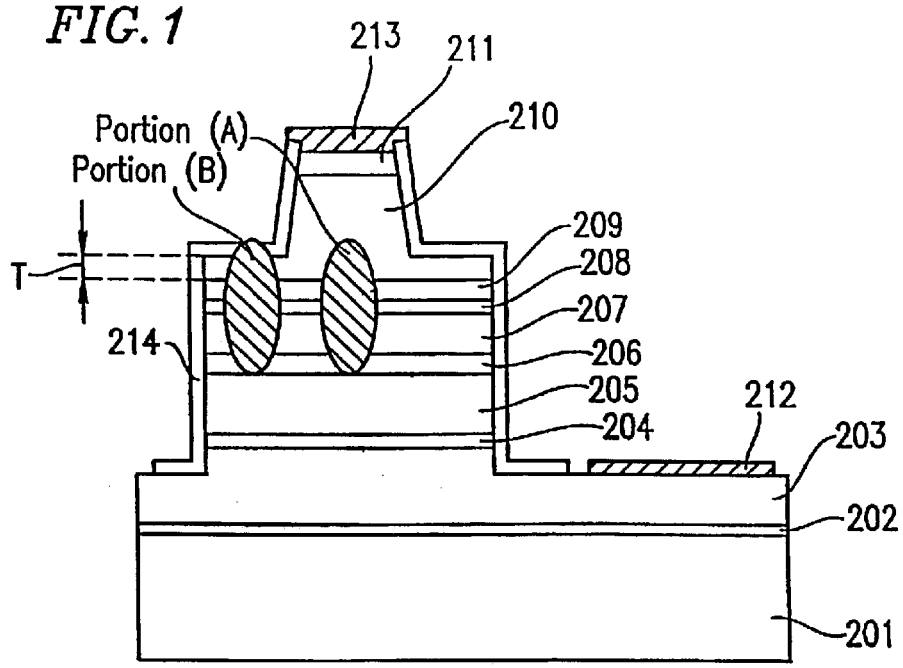
FIG. 1 is a schematic view showing a cross-sectional structure of the conventional semiconductor laser.
Figure 2:
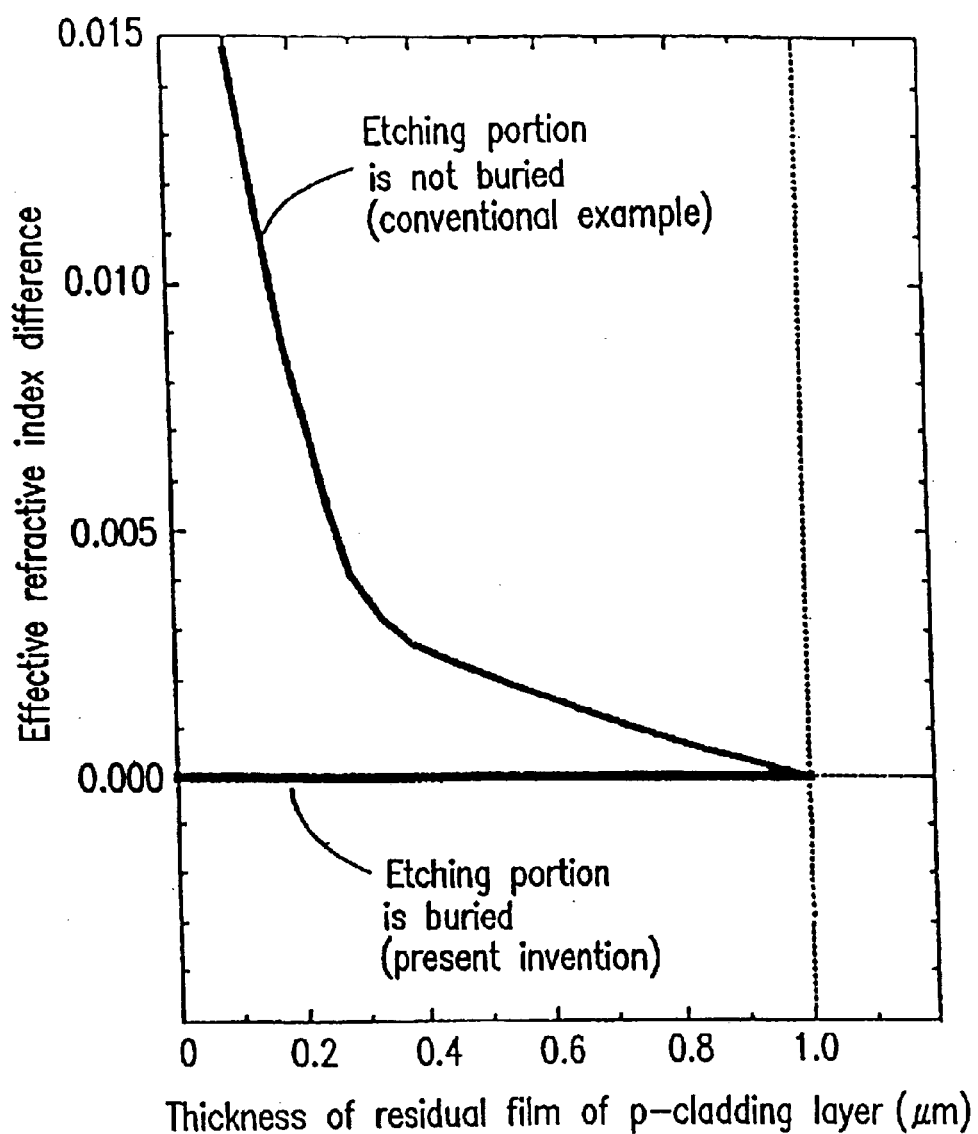
FIG. 2 is a diagram showing a p-cladding layer residual film thickness and an effective refractive index difference in a device structure having no light guide layer, when comparison is made between the conventional example with the present invention.
Figure 3:
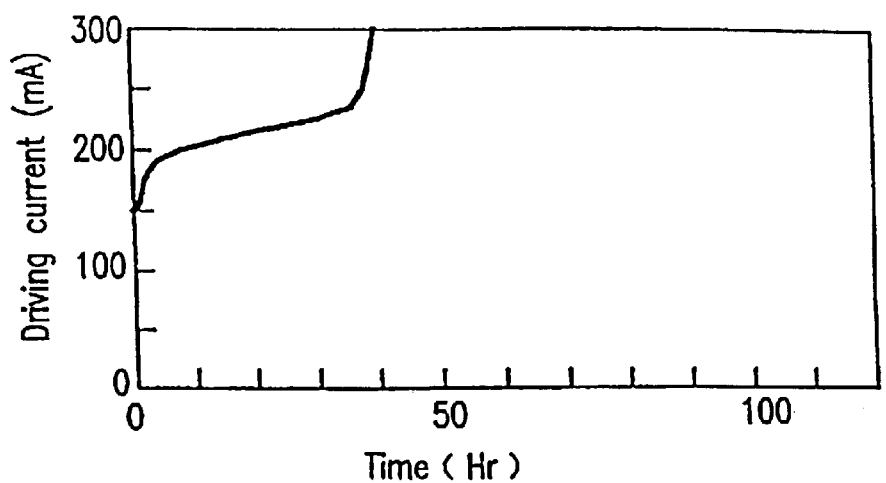
FIG. 3 is a diagram showing the variation of an operating current of the conventional semiconductor laser in continuous electrical conduction at a room temperature.
Figure 4:
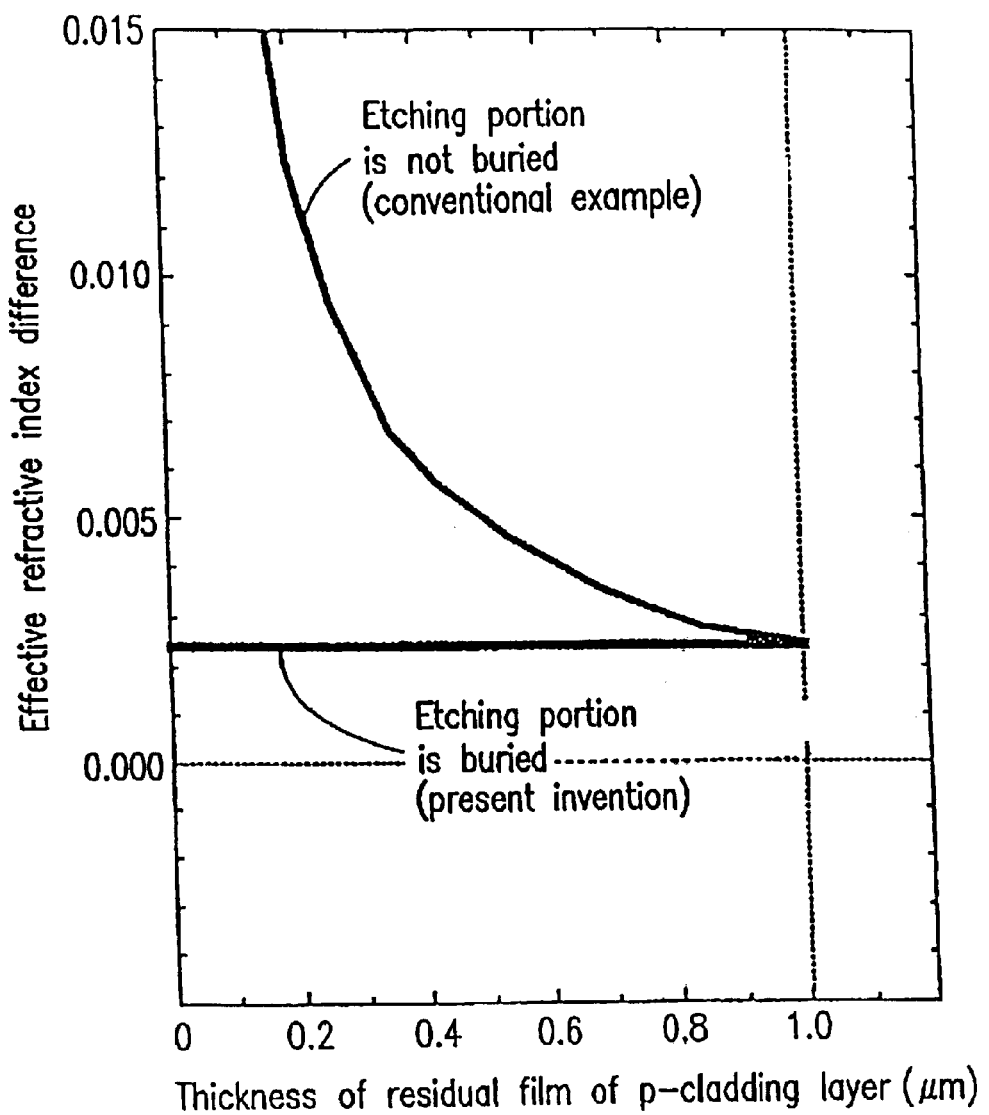
FIG. 4 is a diagram showing a p-cladding layer residual film thickness and an effective refractive index difference in a device structure having a light guide layer, when comparison is made between the conventional example with the present invention.
Figure 5:
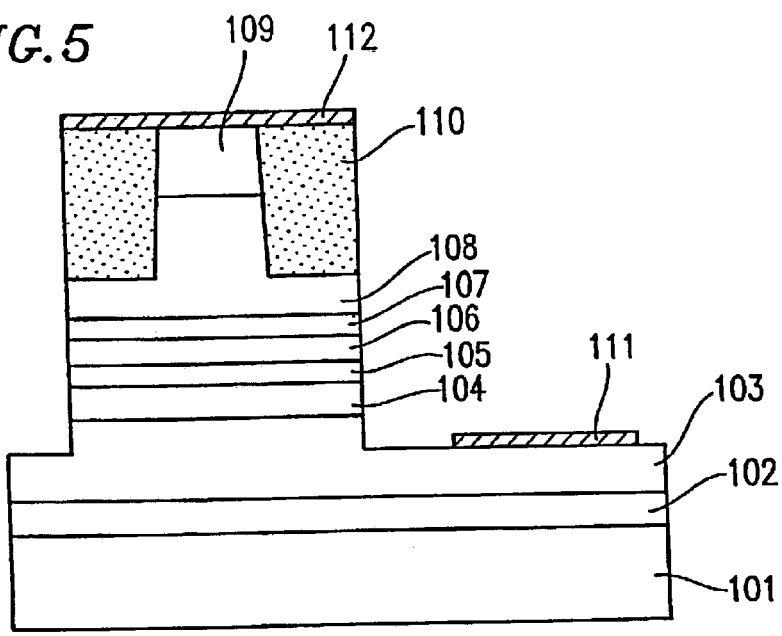
FIG. 5 is a schematic view showing a cross-sectional structure of a semiconductor laser according to Example 1 of the present invention.
Figure 6:
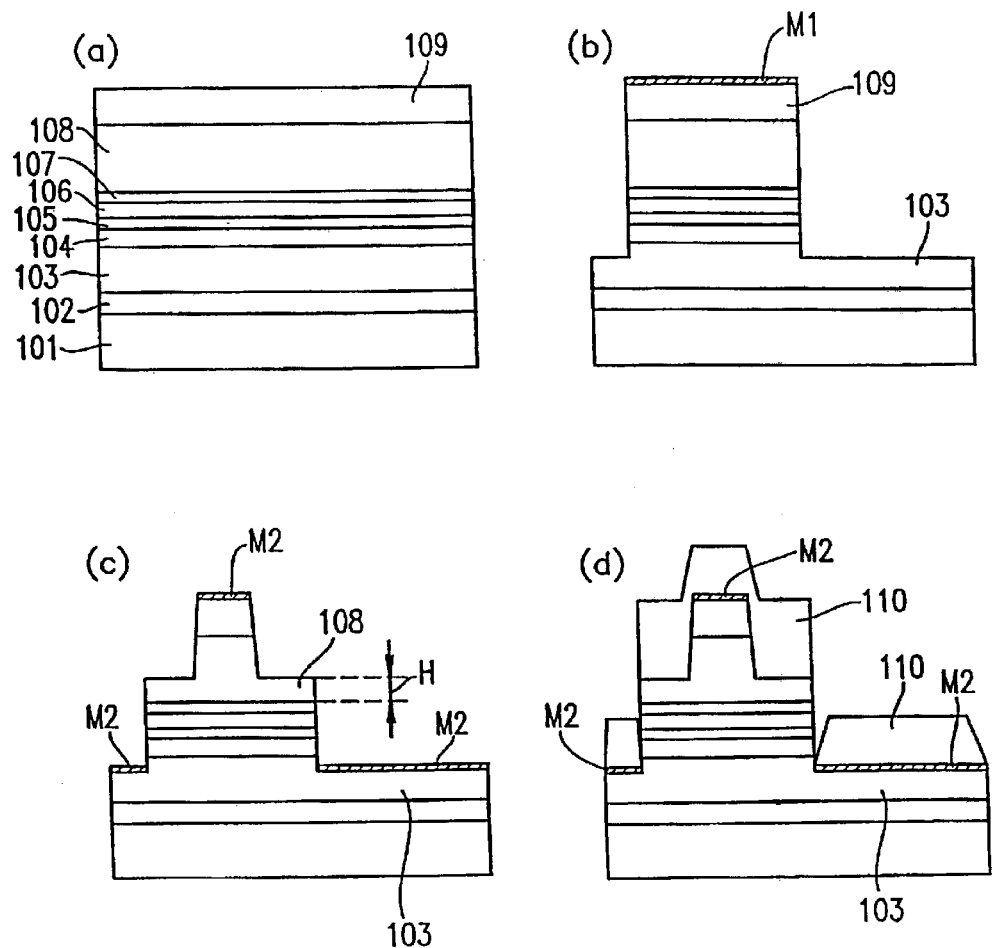
FIG. 6 is a schematic view showing fabrication steps of a semiconductor laser according to Example 1 of the present invention.

FIG. 5 is a diagramatic view showing a cross-sectional structure of a semiconductor laser according to Example 1 of the present invention. FIG. 6 is a diagramatic view showing fabrication steps thereof.

A laser diode of the present example is fabricated according to the following process. First, an undoped GaN buffer layer 102 of 20 nm, an GaN contact layer 103 of n-conduction type (hereinafter, shown as "n-") of 5 μm, an n-$Al_{0.3}Ga_{0.7}N$ cladding layer 104 of 1 μm, an n-GaN light confining layer 105 of 0.1 μm, an active layer 106 of InGaN-MQW structure, a GaN light confining layer 107 having a p-conduction type (hereinafter, shown as "p-") of 0.1 μm, an p-$Al_{0.3}Ga_{0.7}N$ cladding layer 108 of 1 μm, and p-GaN contact layer 109 of 0.5 μm are epitaxially grown on a sapphire substrate 101 having a (0001) plane orientation (plane C) in a sequential manner by a metal organic chemical vapor deposition (MOCVD) method (FIG. 6(a)).

Next, a masking M1 is applied to a portion of the p-contact layer 109, and an unmasked portion of the epitaxial layer is dry etched to an appropriate depth in the n-contact layer 103, thereby forming a mesa shape (FIG. 6(b)).

Next, after the mask M1 has been removed, a portion of a mesa crest and the entire surface of the n-contact layer 103 exposed by etching are covered by a mask M2, and again subjected to dry etching, thereby forming a ridge structure on the upper portion of the mesa. In this case, a depth of etching reaches any position in the p-cladding layer 108; therefore, it is not required to control a thickness H of the residual film (FIG. 6(c)).

Subsequently, a mixture of $TiO_2$ and $ZrO_2$ is deposited on a top surface of a device by an electron beam (EB) deposition method. The thickness of the deposited film is a thickness such that a surface of the deposited film is in the same level as the top surface of the ridge. That is, the ridge portion is buried with a buried layer 110 composed of the mixture of $TiO_2$ and $ZrO_2$ (FIG. 6(d)).

Lastly, a mixture layer 110 of $TiO_2$ and $ZrO_2$, the mask M2 formed on the n-GaN contact layer 103, and a mixture layer of $TiO_2$ and $ZrO_2$ on the mask M2 are removed, and an n-side electrode 111 and a p-side electrode 112 are formed. Thus, a ridge waveguide type laser structure of FIG. 5 is completed.

The semiconductor laser of the present example is designed so that a wavelength of light output from the active layer 106 is about 520 nm. A refractive index of the p-cladding layer 108 is about 2.33 with respect to light having this wavelength. Dielectric for the buried layer is a mixture of $TiO_2$ (refractive index=2.35) and $ZrO_2$ (refractive index=2.05), and regulated such that a refractive index of the deposited mixture film at a wavelength of 520 nm will be 2.33. In this case, a mixture ratio (a mole ratio) of $TiO_2$ and $ZrO_2$ is 93:7. When an emission wavelength is varied due to design change of the active layer, a refractive index of the p-cladding layer 108 varies. In such a case, the refractive index may be regulated by changing the mixture ratio of $TiO_2$ and $ZrO_2$ or altering conditions for deposition.

A type of dielectric is not limited to $TiO_2$ and $ZrO_2$. Any type of dielectric may be used as long as it does not substantially absorb light at an emission wavelength of the laser, i.e., it is transparent for light output from the active layer 106. The phrase "it does not substantially absorb light at an emission wavelength of the laser" herein means that any light absorption which adversely affects a transverse mode of the laser does not occur. Needless to say, a method for forming the dielectric film is not limited to an EB deposition method. Sputtering or other film formation process may be used therefor.

In the thus-formed buried ridge waveguide type semiconductor laser, a current is constricted by the buried layer 110 which is an insulator, and concentrated in a portion right under the ridge portion of the active layer, whereby a gain distribution occurs. On the other hand, a refractive index of the buried layer is equal to that of the p-cladding layer, whereby refractive index distribution does not occur for the light output from the active layer. Therefore, the control for the transverse mode of the laser is easy because it can be controlled by the control of the ridge width. Furthermore, the thickness of the residual film is not required to be precisely controlled, whereby an extent of permissible error is widened and production yield increases.

Figure 7:
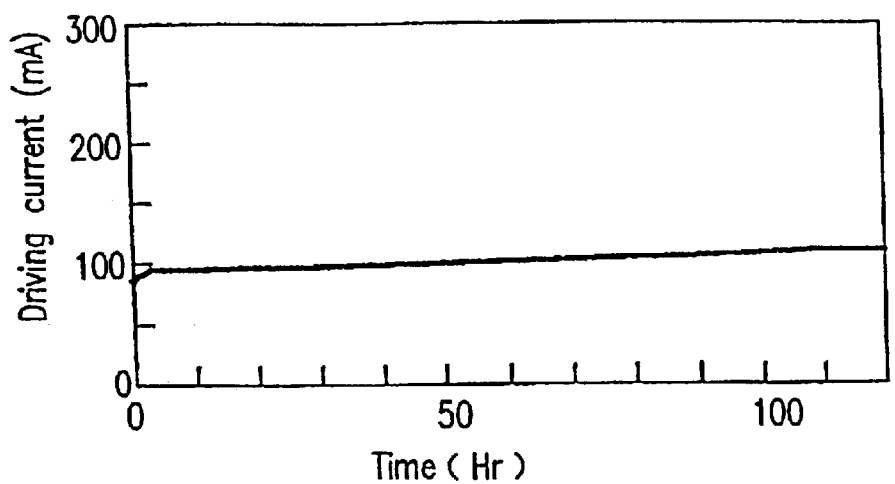
FIG. 7 is a diagram showing a variation of an operating current under the CW operation at room temperature of the semiconductor laser according to Example 1 of the present invention.

Furthermore, a crystal defect due to a flaw generated during the etching process does not propagate to the active layer by a continuous electrical conduction operation because the ridge-shaped stripe portion formed by etching is filled with the buried layer 110 composed of a mixture of $TiO_2$ and $ZrO_2$. Thus, a device having a further improved operating lifetime can be achieved. As shown in FIG. 7, according to the present invention, a lifetime of the device in a continuous electrical conduction at a room temperature reaches 120 hours or more.

EXAMPLE 2

Figure 8:
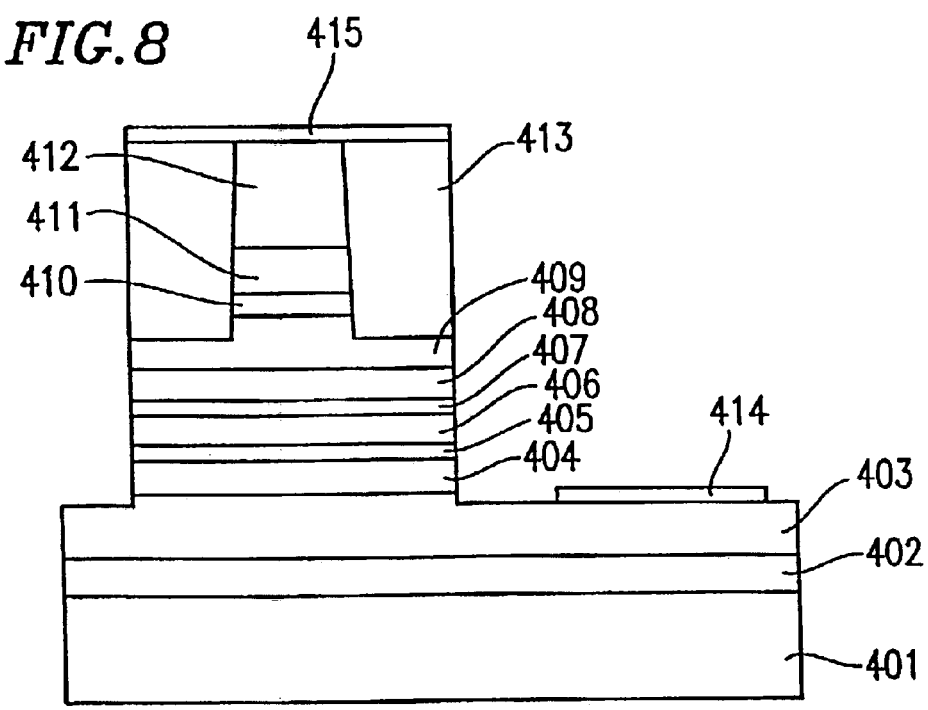
FIG. 8 is a schematic view showing a cross-sectional structure of a semiconductor laser according to Example 2 of the present invention.

FIG. 8 is a schematic view showing a cross-sectional structure of a semiconductor laser according to Example 2 of the present invention. The laser diode of the present invention uses an insulating substrate. A fabrication process thereof has fabrication steps substantially identical with those of Example 1.

First, an undoped GaN buffer layer 402 of 20 nm, an n-GaN contact layer 403 of 5 μm, an n-$Al_{0.08}Ga_{0.92}N$ first cladding layer 404 of 1 μm, an n-GaN light confining layer 405 of 0.1 μm, an active layer 406 of InGaN-MQW structure, a p-$Al_{0.2}Ga_{0.8}N$ evaporation preventing layer 407 of 0.05 μm, a p-GaN light confining layer 408 of 0.1 μm, a p-AlGaN second cladding layer 409 of 0.2 μm, a p-GaN light guiding layer 410 of 0.05 μm, a p-$Al_{0.08}Ga_{0.92}N$ third cladding layer 411 of 0.8 μm, and a p-GaN contact layer 412 of 0.5 μm are epitaxially grown on a sapphire substrate 401 having a (0001) plane orientation (plane C) in a sequential manner by the MOCVD method.

Next, a masking M1 is applied to a portion of the p-contact layer 412, and an unmasked portion of the epitaxial layer is dry etched to an appropriate depth in the n-contact layer 403, thereby forming a mesa shape. Furthermore, after the mask M1 has been removed, a portion of a mesa crest and the entire surface of the n-contact layer 403 exposed by the preceding etching are covered by a mask M2 and is again subjected to dry etching, thereby forming a ridge structure on the upper portion of the mesa. In this case, a depth of etching reaches any position in the p-second cladding layer 409; therefore, it is not required to control the thickness of the residual film. Subsequently, a Cl-doped ZnMgSSe compound is deposited on a top surface of a device by a molecular beam epitaxy (MBE) method. The thickness of the compound layer is a thickness such that a surface of the layer is in the same level as the top surface of the ridge. That is, the ridge portion is buried with a buried layer 413 composed of ZnMgSSe.

Lastly, the mask M1, the mask M2, and the Cl-doped ZnMgSSe compound formed on the mask M1 and the mask M2 are removed, and an n-side electrode 414 and a p-side electrode 415 are formed. Thus, a ridge waveguide type laser structure of FIG. 8 is completed.

The semiconductor laser of the present example is designed so that a wavelength of light output from the active layer 406 is about 410 nm. A refractive index of the p-second cladding layer 409 is about 2.50 with respect to light having this wavelength. Thus, a composition ratio of elements of ZnMgSSe used for the II-VI group semiconductor in the buried layer is regulated such that an energy gap is 3.30 eV or more, and a refractive index is 2.50. When an emission wavelength varies due to a design change of the active layer, a refractive index of the p-second cladding layer 409 also varies. In such a case, the refractive index of the buried layer may be varied by changing the composition ratio of ZnMgSSe. A type of the II-VI group semiconductor is not limited to ZnMgSSe. For example, ZnCdSe may be used. Furthermore, it is needless to say that a method for forming the II-VI group semiconductor film is not limited to epitaxial growth by the MEB method. Sputtering or other thin film formation process may be used therefor.

In the thus-formed ridge waveguide type semiconductor laser, a current is constricted by the Cl-doped ZnMgSSe buried layer 413 showing n-conduction type, and concentrated in the active layer right under the ridge portion of the active layer, whereby a gain distribution occurs. On the other hand, a refractive index of the light guiding layer 410 is larger than refractive indices of the p-second cladding layer 409 and the buried layer 413, and the light guiding layer 410 has been removed outside the ridge, whereby an effective refractive index distribution occurs between the inside and the outside of the ridge portion. Therefore, when compared with Example 1 having no light guide layer, an efficiency of light confinement into a portion right under the ridge improves, whereby the transverse mode control becomes easier.

Furthermore, in the formation of the ridge by dry etching, it is only required that etching reaches at least an interface between the light guiding layer 410 and the second cladding layer 409. Also, over-etching is permissible as long as the etching does not reach the light confining layer 408. Accordingly, it is not required to precisely control the residual film thickness, whereby the production yield improves.

Furthermore, a crystal defect due to a flaw generated during the etching process does not propagate to the active layer under the CW operation because a ridge-shaped stripe portion is buried with the buried layer 413 composed of ZnMgSSe, thereby achieving a device with a significantly improved operating lifetime.

EXAMPLE 3

Figure 9:
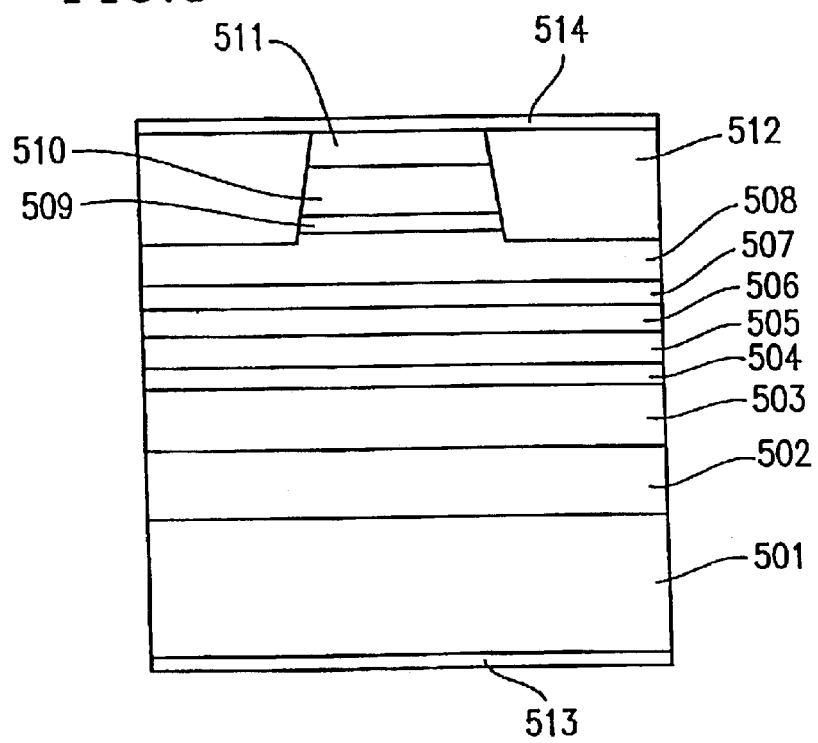
FIG. 9 is a schematic view showing a cross-sectional structure of a semiconductor laser according to Example 3 of the present invention.

FIG. 9 is a schematic view showing a cross-sectional structure of a semiconductor laser according to Example 3 of the present invention. A laser diode of the present example is fabricated according to a process as follows.

First, an undoped GaN buffer layer 502 of 20 nm, an n-$Al_{0.08}Ga_{0.92}N$ first cladding layer 503 of 1 μm, an n-GaN light confining layer 504 of 0.1 μm, an active layer 505 having an InGaN-MQW structure, a p-$Al_{0.2}Ga_{0.08}N$ evaporation preventing layer 506 of 0.05 μm, a p-GaN light confining layer 507 of 0.1 μm. and a p-$Al_{0.08}Ga_{0.92}N$ second cladding layer 508 of 0.2 μm, a p-$Al_{0.02}Ga_{0.98}N$ light guiding layer 509 of 0.05 μm, a p-$Al_{0.08}Ga_{0.92}N$ third cladding layer 510 of 0.8 μm, and a p-GaN contact layer 511 of 0.5 μm are epitaxially grown on an n-SiC substrate 501 in a sequential manner by the MOCVD method.

Next, a mask is applied to a portion of the p-contact layer 511, and an unmasked portion of the epitaxial layer is dry etched to form a ridge structure. In this case, a depth of etching reaches any position in the p-second cladding layer 508; therefore, it is not required to control the thickness of the residual film. Subsequently, an n-$Al_{0.08}Ga_{0.92}N$ layer is formed only on the side surface of the ridge while the mask is left on the top portion of the ridge by selective growth by the MOCVD method. The thickness of the AlGaN layer is a thickness such that a surface of the layer is in the same level as the top surface of the ridge. That is, the ridge portion is buried with a buried layer 512 composed of n-$Al_{0.08}Ga_{0.92}N$.

Lastly, the mask is removed, and an n-side electrode 513 is formed on the back surface of the substrate and a p-side electrode 514 is formed on the top surface of the device. Thus, a ridge waveguide type laser structure of FIG. 9 is completed.

The semiconductor laser of the present example is designed such that a wavelength of light output from the active layer 505 is about 450 nm. A refractive index of the p-second cladding layer 508 is about 2.45 with respect to light having this wavelength. In the present example, the buried layer 512 has a conduction type different from that of the p-second cladding layer 508, but composition of the buried layer 512 is identical with that of the p-second cladding layer 508. A refractive index of the buried layer 512 is about 2.45, which is transparent for light having the emission wavelength.

In the ridge waveguide type semiconductor laser of the present example, a device current is constricted by the buried layer 512, and concentrated in the active layer right under the ridge portion, whereby a gain distribution occurs. On the other hand, a refractive index of the light guiding layer 509 is larger than refractive indexes of the p-second cladding layer 508 and the buried layer 512, and the light guiding layer 509 has been removed outside the ridge, whereby distribution as to an effective refractive index occurs between the inside and the outside of the ridge portion. Therefore, as in Example 2, an efficiency of light confinement into a portion right under the ridge improves, whereby the transverse mode control becomes easier.

Furthermore, in the formation of the ridge by dry etching, it is only required that an etching bottom surface reaches at least an interface between the light guiding layer 509 and the p-second cladding layer 508. Also, over-etching is permissible as long as the etching does not reach the light confining layer 507. Accordingly, it is not required to precisely control the residual film thickness, whereby production yield improves.

EXAMPLE 4

Figure 10:
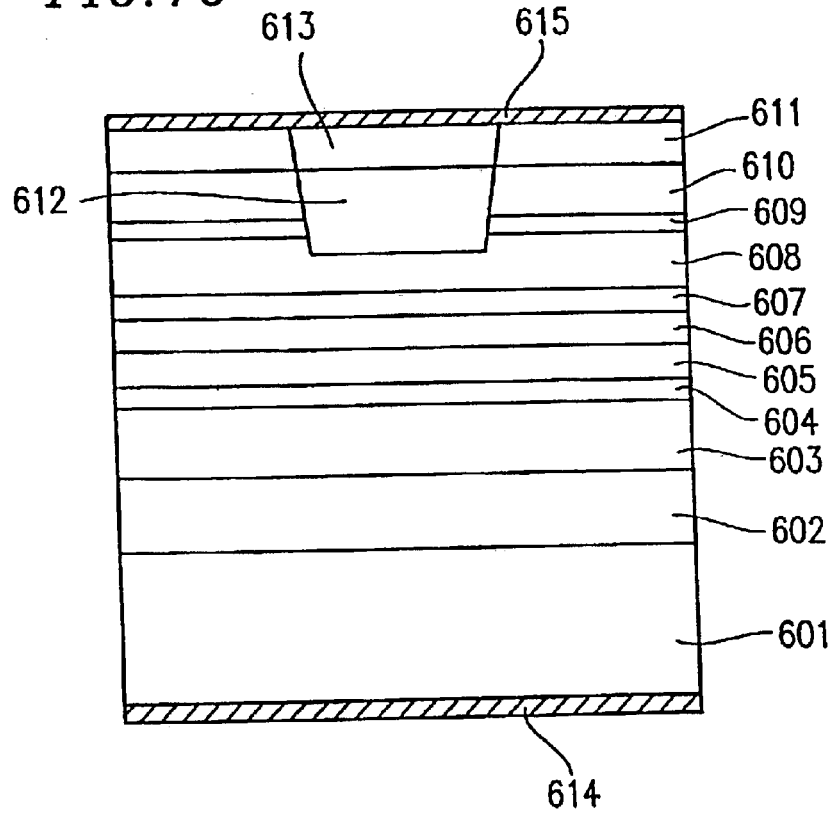
FIG. 10 is a schematic view showing a cross-sectional structure of a semiconductor laser according to Example 4 of the present invention.

FIG. 10 is a schematic view showing a cross-sectional structure of a semiconductor laser according to Example 4 of the present invention, and FIG. 11 is a schematic view showing fabrication steps of the laser. A laser diode of the present example is fabricated according to a process as follows.

First, an undoped GaN buffer layer 602 of 20 nm, an n-$Al_{0.08}Ga_{0.92}N$ first cladding layer 603 of 1 $\mu$m, an n-GaN light confining layer 604 of 0.1 $\mu$m, an active layer 605 of InGaN-MQW structure, a p-$Al_{0.2}Ga_{0.8}N$ evaporation preventing layer 606 of 0.05 $\mu$m, a p-GaN light confining layer 607 of 0.1 $\mu$m, and p-$Al_{0.08}Ga_{0.92}N$ second cladding layer 608 of 0.2 $\mu$m, an n-$Al_{0.3}Ga_{0.7}N$ light reflecting layer 609 of 0.1 $\mu$m, a p-$Al_{0.08}Ga_{0.92}N$ third cladding layer 610 of 0.7 $\mu$m, and a p-GaN contact layer 611 of 0.5 $\mu$m are epitaxially grown on an n-GaN substrate 601 in a sequential manner by the MOCVD method (FIG. 11(a)).

Next, a masking M1 is applied to a portion of the p-contact layer 611, and an unmasked portion of the epitaxial layer is dry etched to form a concave structure R. In this case, a depth of etching reaches any position in the p-second cladding layer 608; therefore, it is not required to control the residual film thickness (FIG. 11(b)).

Subsequently, only inside a groove of the concave structure, a p-$Al_{0.08}Ga_{0.92}N$ layer 612 is epitaxially grown to the vicinity of the interface between the p-third cladding layer 610 and the p-contact layer 611 by selective growth by the MOCVD method, and then, a p-contact layer 613 is epitaxially grown to the vicinity of the surface of the p-contact layer 611 by selective growth by the MOCVD method. That is, the groove portion of the concave structure is buried with the buried layer 612 composed of p-$Al_{0.08}Ga_{0.92}N$ (FIG. 11(c)).

Lastly, the mask M1 is removed, and an n-side electrode 614 is formed on the back surface of the substrate and a p-side electrode 615 is formed on the top surface of the device (FIG. 10). Thus, the laser structure of FIG. 10 is completed.

The semiconductor laser of the present example is designed such that a wavelength of light output from the active layer 605 is about 430 nm. In the present example, the buried layer 612 is identical in a conduction type and a composition with the p-second cladding layer 608, and the light reflecting layer 609 having an opening portion corresponding to the groove portion of the concave structure functions as a current blocking layer because of the difference in the conduction type, whereby a device current is concentrated in the active layer right under the groove portion (opening portion). As a result, a gain distribution occurs in the lateral direction of the laser.

On the other hand, a refractive index of the light reflecting layer 609 provided to portions other than the groove portion is smaller than refractive indexes of the p-second cladding layer 608 and the buried layer 612. Furthermore, since a refractive index is uniform over the groove portion, an effective refractive index of light in a portion other than the groove portion is small. Therefore, the effective refractive index is different between the inside and the outside of the stripe structure. Thus, an efficiency of light confinement into the stripe portion improves, whereby the transverse mode control becomes easier.

Furthermore, in the formation of the groove structure by dry etching, it is only required that an etching bottom surface reaches at least an interface between the light reflecting layer 609 and the p-second cladding layer 608. Also, over-etching is permissible as long as the etching does not reach the light confining layer 607. Accordingly, it is not required to precisely control the residual film thickness, whereby the production yield improves. In Example 4, structural parts which are not described in the claims such as various substrates, a buffer layer, a light confinement layer, etc., are used. These are used for forming a laser device having superior characteristics, and do not affect the practice of the present invention regarding the structure of the ridge portion.

Industrial Applicability

According to the present invention, a semiconductor laser having a single transverse mode characteristic can be produced with high production yield because the transverse mode of a ridge waveguide type semiconductor laser is not controlled with an etching residual film thickness, as is controlled in the prior art.

What is claimed is:

1. A method for manufacturing a compound semiconductor laser, comprising, the steps of, in the following order,
   forming a first stacked layer unit consisting of a III group nitride semiconductor formed on a substrate and including a first cladding layer,
   forming an active layer consisting of a III group nitride semiconductor,
   forming a second stacked layer unit consisting of a III group nitride semiconductor and including a second cladding layer,
   forming a ridge portion having a projecting portion of stripe shape within the second stacked layer unit by dry etching, and
   forming a buried layer at both sides of the ridge portion so that the ridge portion is put within the buried layer,
   wherein the buried layer consists of an insulating film including at least one or more types of dielectric materials selected from the group including $TiO_2$, $ZrO_2$, $HfO_2$, $CeO_2$, $In_2O_3$, $Nd_2O_3$, $Sb_2O_3$, $Sn_2O$, $Ta_2O_5$ and ZnO.

2. A method according to claim 1, wherein the second cladding layer consists of a III group nitride semiconductor including Al and Ga.

3. A method according to claim 1, wherein the active layer is a MQW active layer including InGaN.

4. A method according to claim 1, wherein the second stacked layer unit includes the second cladding layer and a contact layer formed on the second cladding layer.

5. A method according to claim 1, wherein the second stacked layer unit includes a light confining layer and the second cladding layer formed on the light confining layer.

6. A method according to claim 1, wherein the second stacked layer unit includes the second cladding layer, a light guiding layer formed on the second cladding layer, and a third cladding layer formed on the light guiding layer.

* * * * *